United States Patent
Kim

(10) Patent No.: US 12,087,657 B2
(45) Date of Patent: Sep. 10, 2024

(54) SEMICONDUCTOR PACKAGES

(71) Applicant: Samsung Electronics Co., Ltd., Suwon-si (KR)

(72) Inventor: Woojae Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 350 days.

(21) Appl. No.: 17/551,710

(22) Filed: Dec. 15, 2021

(65) Prior Publication Data
US 2022/0375812 A1 Nov. 24, 2022

(30) Foreign Application Priority Data
May 21, 2021 (KR) .................. 10-2021-0065565

(51) Int. Cl.
*H01L 23/367* (2006.01)
*H01L 23/00* (2006.01)
*H01L 23/433* (2006.01)

(52) U.S. Cl.
CPC ........ *H01L 23/3675* (2013.01); *H01L 23/433* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(58) Field of Classification Search
CPC .... H01L 23/3675; H01L 23/433; H01L 24/16
See application file for complete search history.

(56) References Cited

U.S. PATENT DOCUMENTS

| | | | |
|---|---|---|---|
| 7,755,184 B2 | 7/2010 | Macris et al. | |
| 8,837,149 B2 | 9/2014 | Hirose et al. | |
| 2004/0036183 A1 | 2/2004 | Im et al. | |
| 2006/0118925 A1* | 6/2006 | Macris | ............. H01L 23/26 |
| | | | 257/667 |
| 2014/0151870 A1 | 6/2014 | Kim | |
| 2015/0221625 A1 | 8/2015 | Chun et al. | |
| 2019/0045666 A1 | 2/2019 | Liang et al. | |
| 2020/0183323 A1* | 6/2020 | Shen | ............. G03G 21/185 |

FOREIGN PATENT DOCUMENTS

| | | |
|---|---|---|
| JP | 2018-060986 A | 4/2018 |
| KR | 10-1998-0084769 A | 12/1998 |
| KR | 10-2000-0073868 A | 12/2000 |

(Continued)

*Primary Examiner* — Errol V Fernandes
(74) *Attorney, Agent, or Firm* — Harness, Dickey & Pierce, P.L.C.

(57) ABSTRACT

A semiconductor package includes a package substrate, a semiconductor chip on the package substrate, a heat dissipation structure on the package substrate, the heat dissipation structure including a center portion and an edge portion, a dam structure on a bottom surface of the center portion of the heat dissipation structure, the dam structure on a top surface of the semiconductor chip, and a heat conductive layer between the center portion of the heat dissipation structure and the semiconductor chip. A top surface of the dam structure is located at a same distance from a top surface of the package substrate in a vertical direction as a top surface of the heat conductive layer, wherein the vertical direction is perpendicular to the top surface of the package substrate.

19 Claims, 10 Drawing Sheets

(56) References Cited

FOREIGN PATENT DOCUMENTS

| KR | 10-2003-0023986 A | 3/2003 |
|---|---|---|
| KR | 10-0446290 B1 | 9/2004 |
| KR | 10-2005-0027383 A | 3/2005 |
| KR | 10-2008-0014267 A | 2/2008 |
| KR | 10-1088087 B1 | 11/2011 |
| KR | 10-1220940 B1 | 1/2013 |
| KR | 10-2013-0089115 A | 8/2013 |
| KR | 10-2013-0107670 A | 10/2013 |
| KR | 10-2014-0070141 A | 6/2014 |
| KR | 10-2015-0091886 A | 8/2015 |
| KR | 10-1662265 B1 | 10/2016 |
| KR | 10-2017-0062100 A | 6/2017 |

* cited by examiner

SEMICONDUCTOR PACKAGES

CROSS-REFERENCE TO RELATED APPLICATION

This U.S. Non-Provisional patent application claims priority under 35 U.S.C. § 119 to Korean Patent Application No. 10-2021-0065565, filed on May 21, 2021, in the Korean Intellectual Property Office, the disclosure of which is hereby incorporated by reference in its entirety.

BACKGROUND

Example embodiments of the inventive concepts relate to semiconductor packages and, more particularly, to semiconductor packages including a heat dissipation structure.

An integrated circuit chip may be realized in the form of a semiconductor package so as to be appropriately applied to an electronic product. In a typical semiconductor package, a semiconductor chip may be mounted on a printed circuit board (PCB) and may be electrically connected to the PCB through bonding wires or bumps. As working speeds and capacities of semiconductor packages have been increased, power consumption of the semiconductor packages has also been increased. Thus, the importance of thermal properties of semiconductor packages have been increased.

SUMMARY

Some example embodiments of the inventive concepts provide a semiconductor package with improved heat dissipation efficiency.

In some example embodiments of the inventive concepts, a semiconductor package may include a package substrate, a semiconductor chip on the package substrate, a heat dissipation structure on the package substrate, the heat dissipation structure including a center portion and an edge portion, a dam structure on a bottom surface of the center portion of the heat dissipation structure, the dam structure on a top surface of the semiconductor chip, and a heat conductive layer between the center portion of the heat dissipation structure and the semiconductor chip. A top surface of the dam structure may be located at a same distance from a top surface of the package substrate in a vertical direction as a top surface of the heat conductive layer, wherein the vertical direction is perpendicular to the top surface of the package substrate.

In some example embodiments of the inventive concepts, a semiconductor package may include a package substrate, a first semiconductor chip on the package substrate, a heat dissipation structure on the package substrate, the heat dissipation structure including a center portion and an edge portion, a first heat conductive layer between the center portion of the heat dissipation structure and the first semiconductor chip, and a first dam structure between the center portion of the heat dissipation structure and the first semiconductor chip and covering a sidewall of the first heat conductive layer. The first dam structure may include a silicone-based polymer.

In some example embodiments of the inventive concepts, a semiconductor package may include a package substrate that includes substrate pads adjacent to a top surface of the package substrate, a semiconductor chip on the package substrate, the semiconductor chip including chip pads adjacent to a bottom surface of the semiconductor chip, chip bumps between the substrate pads and the chip pads, a chip underfill layer between the package substrate and the semiconductor chip, a heat dissipation structure on the package substrate, the heat dissipation structure including a center portion and an edge portion, a dam structure on a bottom surface of the center portion of the heat dissipation structure, and a heat conductive layer between the center portion of the heat dissipation structure and the semiconductor chip. A contact surface between the heat dissipation structure and the dam structure may be flat. A top surface of the center portion of the heat dissipation structure may be located further from the top surface of the package substrate in a vertical direction than a top surface of the edge portion of the heat dissipation structure, wherein the vertical direction is perpendicular to the top surface of the package substrate. The bottom surface of the center portion of the heat dissipation structure may be located further from the top surface of the package substrate in the vertical direction than a bottom surface of the edge portion of the heat dissipation structure.

BRIEF DESCRIPTION OF THE DRAWINGS

The inventive concepts will become more apparent in view of the attached drawings and accompanying detailed description.

DETAILED DESCRIPTION

Figure 1:
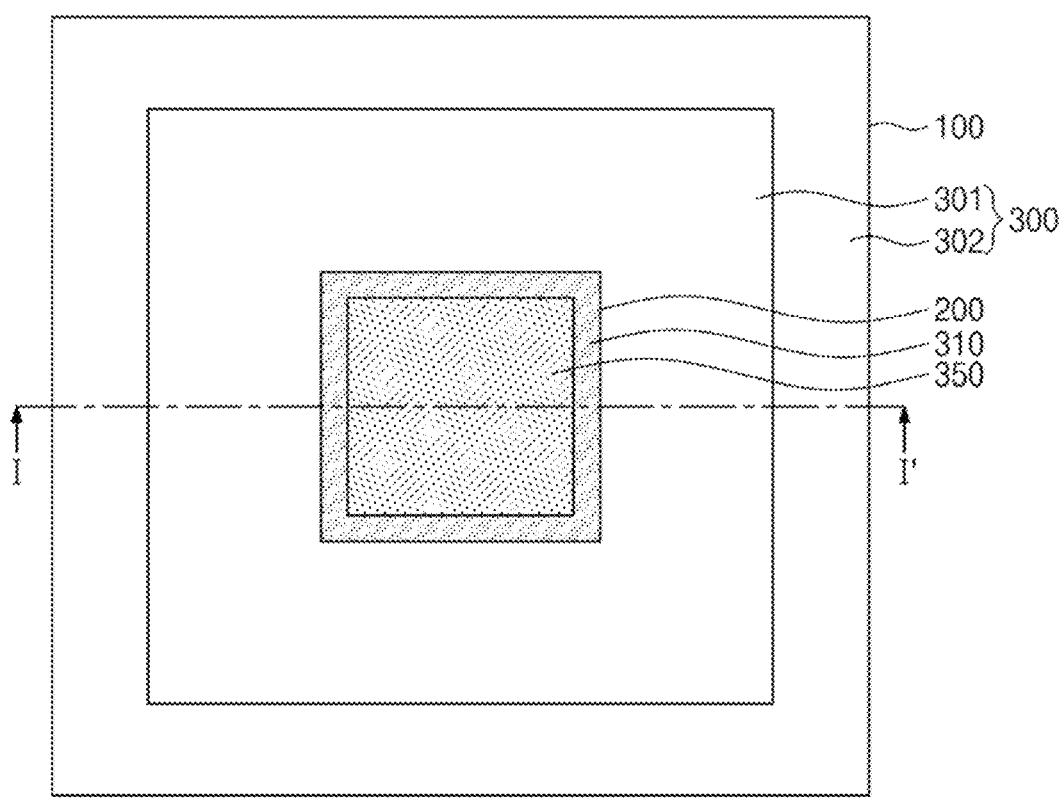
FIG. 1 is a plan view illustrating a semiconductor package according to some example embodiments of the inventive concepts.

Hereinafter, some example embodiments of the inventive concepts will be described in more detail with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," "flat," or the like with regard to other elements and/or properties thereof (e.g., structures, surfaces, directions, or the like) may be "perpendicular," "parallel,"

"coplanar," "flat" or the like or may be "substantially perpendicular," "substantially parallel," "substantially coplanar," "substantially flat," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

Elements and/or properties thereof (e.g., structures, surfaces, directions, or the like) that are "substantially flat" will be understood to be "flat" thereof within manufacturing tolerances and/or material tolerances and/or have a deviation in magnitude and/or angle from "flat" that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2:
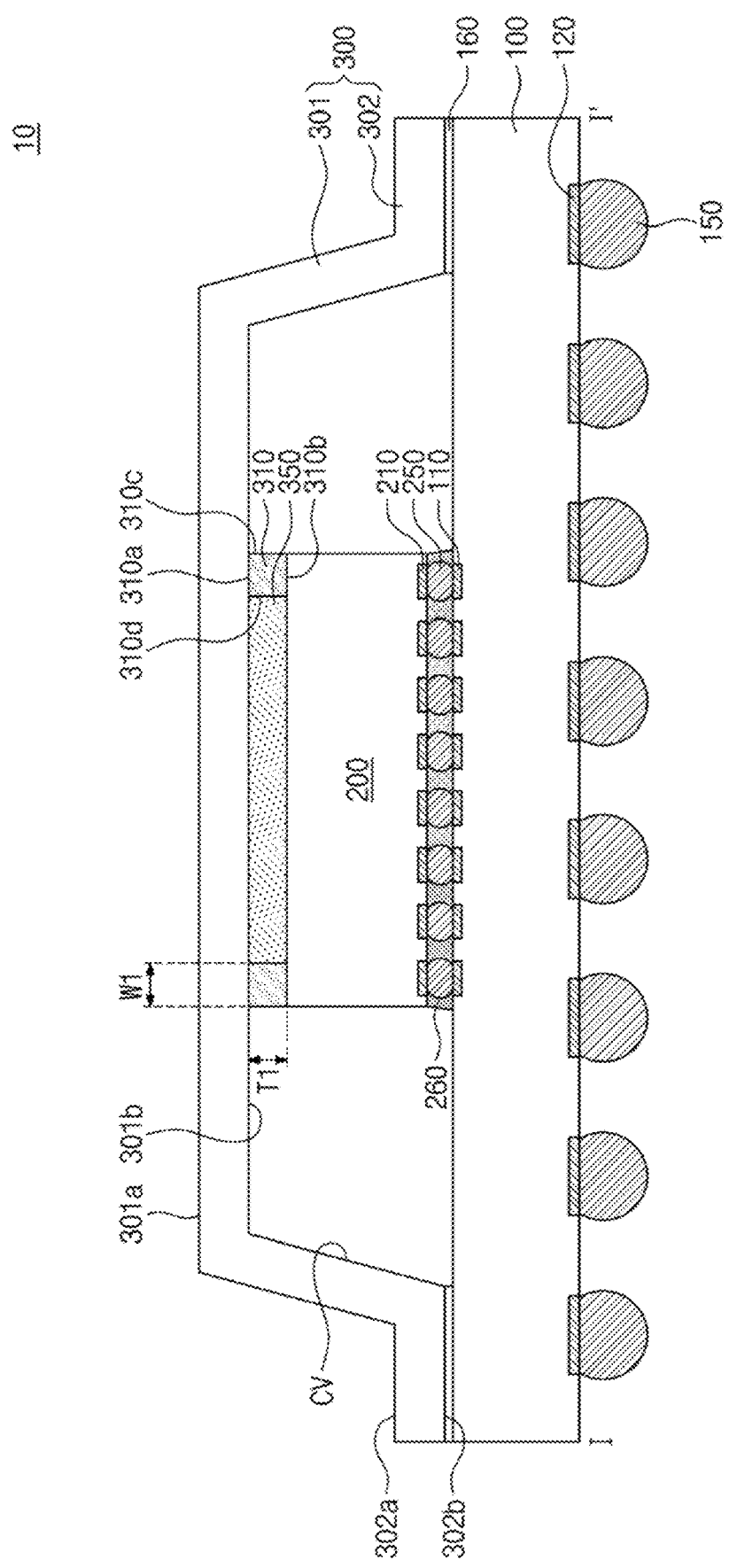
FIG. 2 is a cross-sectional view taken along a line I-I' of FIG. 1 to illustrate a semiconductor package according to some example embodiments of the inventive concepts.

FIG. 1 is a plan view illustrating a semiconductor package according to some example embodiments of the inventive concepts. FIG. 2 is a cross-sectional view taken along a line I-I' of FIG. 1 to illustrate a semiconductor package according to some example embodiments of the inventive concepts.

Referring to FIGS. 1 and 2, a semiconductor package 10 may include a package substrate 100, a semiconductor chip 200 on the package substrate 100, a heat dissipation structure 300 on the package substrate 100, a dam structure 310, and a heat conductive layer 350. The package substrate 100 may be provided. For example, the package substrate 100 may be a printed circuit board (PCB). The package substrate 100 may include substrate pads 110 and terminal pads 120. The substrate pads 110 may be adjacent to a top surface of the package substrate 100, and the terminal pads 120 may be adjacent to a bottom surface of the package substrate 100. The substrate pads 110 may be exposed at the top surface of the package substrate 100. Substrate wiring lines (not shown) may be provided in the package substrate 100. The substrate pads 110 and the terminal pads 120 may be electrically connected to the substrate wiring lines (not shown). In the present specification, it will be understood that when a component is referred to as being "electrically connected" to another component, it may be connected directly to the other component or an intervening component may be present. The substrate pads 110 and the terminal pads 120 may include a conductive metal material and may include at least one metal of, for example, copper (Cu), aluminum (Al), tungsten (W), or titanium (Ti).

External terminals 150 may be provided on the bottom surface of the package substrate 100. The external terminals 150 may be disposed on bottom surfaces of the terminal pads 120 so as to be electrically connected to the terminal pads 120, respectively. The external terminals 150 may be connected to an external device. Thus, external electrical signals may be transmitted to the substrate pads 110 through the external terminals 150, and internal electrical signals may be transmitted from the substrate pads 110 to the external device through the external terminals 150. The external terminals 150 may include solder balls or solder bumps. The external terminals 150 may include a conductive metal material and may include at least one metal of, for example, tin (Sn), lead (Pb), silver (Ag), zinc (Zn), nickel (Ni), gold (Au), copper (Cu), aluminum (Al), or bismuth (Bi).

The semiconductor chip 200 may be mounted on the top surface of the package substrate 100. The semiconductor chip 200 may include a memory chip, a logic chip, or a system-on-chip (SOC). For some examples, the semiconductor chip 200 may be an ASIC chip or an application processor (AP) chip. The ASIC chip may include an application specific integrated circuit (ASIC). For example, the semiconductor chip 200 may include a central processing unit (CPU) or a graphic processing unit (GPU). The semiconductor chip 200 may include chip pads 210 adjacent to a bottom surface of the semiconductor chip 200. The chip pads 210 may be electrically connected to corresponding substrate pads 110. The chip pads 210 may include a conductive material and may include at least one of, for example, copper (Cu), aluminum (Al), tungsten (W), or titanium (Ti).

Chip bumps 250 may be disposed between (e.g., directly between or indirectly between) the substrate pads 110 and the chip pads 210. The semiconductor chip 200 may be electrically connected to the package substrate 100 through the chip bumps 250. The chip bumps 250 may include solder balls or solder bumps. The chip bumps 250 may include a conductive material and may include at least one metal of, for example, tin (Sn), lead (Pb), silver (Ag), zinc (Zn), nickel (Ni), gold (Au), copper (Cu), aluminum (Al), or bismuth (Bi). A pitch of the chip bumps 250 may be less than a pitch of the external terminals 150.

A chip underfill layer 260 may be disposed between the package substrate 100 and the semiconductor chip 200. The chip underfill layer 260 may fill a space between the chip bumps 250 and may seal or encapsulate the chip bumps 250. For example, the chip underfill layer 260 may include a non-conductive film (NCF) such as an Ajinomoto build-up film (ABF).

The heat dissipation structure 300 may be provided on the package substrate 100. The heat dissipation structure 300 may include a center portion 301 and an edge portion 302. The center portion 301 of the heat dissipation structure 300 may be disposed on a center region of the package substrate 100. For example, as shown in at least FIG. 2, a cross section of the center portion 301 of the heat dissipation structure 300 may have an inverted U-shape. As shown in at least FIG. 1, the edge portion 302 of the heat dissipation structure 300 may be disposed on an edge region of the package substrate 100 when viewed in a plan view. As shown in at least FIG. 1, the edge portion 302 of the heat dissipation structure 300 may partially or completely surround the center portion 301 of the heat dissipation structure 300 when viewed in a plan view. As shown in at least FIG. 1, the edge portion 302 of the heat dissipation structure 300 may have a rectangular ring shape when viewed in a plan view. A top surface 301a of the center portion 301 of the heat dissipation structure 300 may be located at a higher level than a top surface of the semiconductor chip 200. A top surface 302a of the edge portion 302 of the heat dissipation structure 300 may be located at a lower level than the top surface of the semiconductor chip 200. In other words, the top surface 301a of the center portion 301 of the heat dissipation structure 300 may be located at a higher level than the top surface 302a of the edge portion 302 of the heat dissipation structure 300. A bottom surface 301b of the center portion 301 of the heat dissipation structure 300 may be flat. The bottom surface 301b of the center portion 301 of the heat dissipation structure 300 may be located at a higher level than the top surface of the semiconductor chip 200. A bottom surface 302b of the edge portion 302 of the heat dissipation structure 300 may be located at a lower level than the top surface of the semiconductor chip 200. In other words, the bottom surface 301b of the center portion 301 of the heat dissipation structure 300 may be located at a higher level than the bottom surface 302b of the edge portion 302 of the heat dissipation structure 300.

In the present specification, the term 'level' may mean a vertical height from the top surface of the package substrate 100 and/or a distance from the top surface of the package substrate 100 in a vertical direction that is perpendicular to the top surface of the package substrate 100. Therefore, when a first element is described herein to be at a higher level than a second element, the first element may be further from the top surface of the package substrate 100 in the vertical direction than the second element. Furthermore, when a first element is described herein to be at a lower level than a second element, the first element may be closer to the top surface of the package substrate 100 in the vertical direction than the second element. Furthermore, when a first element is described herein to be at a same or substantially same level as a second element, the first element may be equally distant from/close to the top surface of the package substrate 100 in the vertical direction as the second element.

For example, the bottom surface 301b of the center portion 301 of the heat dissipation structure 300 may be further from the top surface of the package substrate 100 in the vertical direction than the top surface of the semiconductor chip 200, and a top surface 302a of the edge portion 302 of the heat dissipation structure 300 may be closer to the top surface of the package substrate 100 in the vertical direction than the top surface of the semiconductor chip 200.

In another example, the top surface 301a of the center portion 301 of the heat dissipation structure 300 may be located further from the top surface of the package substrate 100 in the vertical direction than the top surface 302a of the edge portion 302 of the heat dissipation structure 300, and the bottom surface 301b of the center portion 301 of the heat dissipation structure 300 may be located further from the top surface of the package substrate 100 in the vertical direction than the bottom surface 302b of the edge portion 302 of the heat dissipation structure 300.

The heat dissipation structure 300 may have a cavity CV defined by an inner sidewall of the center portion 301. Restated, the heat dissipation structure 300 may have an inner sidewall of the center portion 301 that at least partially or entirely defines the cavity CV. The semiconductor chip 200 may be disposed in (e.g., located partially or entirely within) the cavity CV as at least partially or entirely defined by the inner sidewall of the center portion 301 of the heat dissipation structure 300.

The center portion 301 and the edge portion 302 of the heat dissipation structure 300 may include the same material. The center portion 301 and the edge portion 302 of the heat dissipation structure 300 may be provided in one body. In other words, the center portion 301 and the edge portion 302 may be connected to each other without an interface therebetween. The heat dissipation structure 300 may include a heat slug or a heat sink. The heat dissipation structure 300 may include a heat conductive material. The heat conductive material may include a metal (e.g., copper and/or aluminum) or a carbon-containing material (e.g., graphene, graphite, and/or carbon nanotube). The heat dissipation structure 300 may have a relatively high thermal conductivity.

Thermal properties of the semiconductor package 10 may be improved by the heat dissipation structure 300. For example, when the semiconductor package 10 operates, heat generated from the semiconductor chip 200 may be transmitted to the heat dissipation structure 300. Thus, the heat dissipation structure 300 may quickly dissipate the received heat to the outside.

The dam structure 310 may be provided on (e.g., directly or indirectly beneath) the bottom surface 301b of the center portion 301 of the heat dissipation structure 300. The dam structure 310 may be disposed between the center portion 301 of the heat dissipation structure 300 and the semiconductor chip 200. The dam structure 310 may be disposed on (e.g., directly or indirectly above) the top surface of the semiconductor chip 200 and may be vertically spaced apart from the package substrate 100. A bottom surface 310b of the dam structure 310 may be in contact with the top surface of the semiconductor chip 200. As shown in at least FIG. 2, a contact surface between the heat dissipation structure 300 and the dam structure 310 may be flat. The dam structure 310 may be disposed on an edge region of the semiconductor chip 200 when viewed in a plan view. For example, the dam structure 310 may have a rectangular ring shape when viewed in a plan view. In some example embodiments, an outer sidewall 310c of the dam structure 310 may be vertically aligned with a sidewall of the semiconductor chip 200. As used herein, elements that are "vertically aligned" may partially or completely overlap in the vertical direction that is perpendicular to the top surface of the package substrate 100 and/or may be coplanar in the vertical direction. The outer sidewall 310c of the dam structure 310 may overlap with the sidewall of the semiconductor chip 200 in the vertical direction such that the outer sidewall 310c of the dam structure 310 is coplanar with the sidewall of the semiconductor chip 200 (e.g., coplanar in the vertical direction). The outer sidewall 310c and an inner sidewall 310d of the dam structure 310 may be flat or substantially flat. For example, a first thickness T1 of the dam structure 310 in the vertical direction may range from about 50 μm to about 150 μm. In the present specification, the term 'thickness' may mean a distance between a top surface and a bottom surface, e.g., in a vertical direction that is perpendicular to the top surface of the package substrate 100. For example, a first width W1 between the outer sidewall 310c and the inner sidewall 310d of the dam structure 310 (e.g., in a horizontal direction that is parallel to the top surface of the package substrate 100) may range from about 50 μm to about 200 μm.

The dam structure 310 may include a material having elasticity and heat resistance. For example, the dam structure 310 may have the heat resistance in which its physical and/or chemical properties do not change even at a high temperature (e.g., about 260 degrees Celsius). The dam structure 310 may include a material which does not react with the heat conductive layer 350, to be described later in detail, at a room temperature or a high temperature. The dam structure 310 may include a polymer and may include, for example, a silicone-based polymer.

The dam structure 310 may be adhered or attached on the bottom surface 301b of the center portion 301 of the heat dissipation structure 300, and thus the heat dissipation structure 300 and the dam structure 310 may be provided in one structure.

The heat conductive layer 350 may be disposed between the center portion 301 of the heat dissipation structure 300 (e.g., a bottom surface of the heat dissipation structure 300, such that the bottom surface 301b of the center portion 301 of the heat dissipation structure 300) and the semiconductor chip 200 (e.g., between the heat dissipation structure 300 and the semiconductor chip 200 in a vertical direction that is perpendicular to the top surface of the package substrate 100) and between the inner sidewalls 310d of the dam structure 310 (e.g., between the inner sidewalls 310d of the dam structure 310 in a horizontal direction that is parallel to the top surface of the package substrate 100). The heat conductive layer 350 may be disposed on the top surface of the semiconductor chip 200. The heat conductive layer 350 may be in direct contact with the bottom surface 301b of the center portion 301 of the heat dissipation structure 300, the top surface of the semiconductor chip 200, and the inner sidewalls 310d of the dam structure 310. The dam structure 310 may cover a sidewall of the heat conductive layer 350. The top surface 310a of the dam structure 310 may be located at the same level as a top surface of the heat conductive layer 350. For example, as shown in FIG. 2, the top surface 310a of the dam structure 310 may be located at a same distance from the top surface of the package substrate 100 in a vertical direction as the top surface of the heat conductive layer 350, where the vertical direction is perpendicular to the top surface of the package substrate 100. The bottom surface 310b of the dam structure 310 may be located at the same level as a bottom surface of the heat conductive layer 350. For example, as shown in FIG. 2, the bottom surface 310b of the dam structure 310 may be located at a same distance from the top surface of the package substrate 100 in a vertical direction as the bottom surface of the heat conductive layer 350, where the vertical direction is perpendicular to the top surface of the package substrate 100. Thus, the heat conductive layer 350 may not come out of the dam structure 310 but may be fixed between the heat dissipation structure 300 and the semiconductor chip 200.

The heat conductive layer 350 may have a thermal conductivity higher than that of air. The heat conductive layer 350 may include a thermal interface material (TIM). For example, the thermal interface material (TIM) may include a polymer and heat conductive particles. The heat conductive particles may be dispersed in the polymer.

According to some example embodiments of the inventive concepts, the dam structure 310 and the heat dissipation structure 300 may be disposed on the semiconductor chip 200. Thus, the heat conductive layer 350 may not flow out the top surface of the semiconductor chip 200 even in a high temperature state, and it is possible to prevent a void from being generated in the heat conductive layer 350. The heat conductive layer 350 may fill a gap region between the center portion 301 of the heat dissipation structure 300 and the semiconductor chip 200 and between the inner sidewalls 310d of the dam structure 310, and thus heat generated from the semiconductor chip 200 may be quickly transmitted to the heat dissipation structure 300 through the heat conductive layer 350. As a result, the semiconductor package 10 with improved heat dissipation efficiency may be provided.

An adhesive pattern 160 may be disposed between the package substrate 100 and the edge portion 302 of the heat dissipation structure 300. The adhesive pattern 160 may be in contact with the bottom surface 302b of the edge portion 302 of the heat dissipation structure 300. The adhesive pattern 160 may be disposed on the edge region of the package substrate 100. For example, the adhesive pattern 160 may include an adhesive material. The edge portion 302 of the heat dissipation structure 300 may be adhered on the package substrate 100 (e.g., affixed on the package substrate 100, fixed on the package substrate 100, etc.) by the adhesive pattern 160. Thus, the heat dissipation structure 300 may be firmly fixed on the package substrate 100.

FIGS. 3, 4, 5, and 6 are cross-sectional views illustrating a method of manufacturing a semiconductor package according to some example embodiments of the inventive concepts. Hereinafter, the descriptions to the same features as described above will be omitted for the purpose of ease and convenience in explanation.

Figure 3:
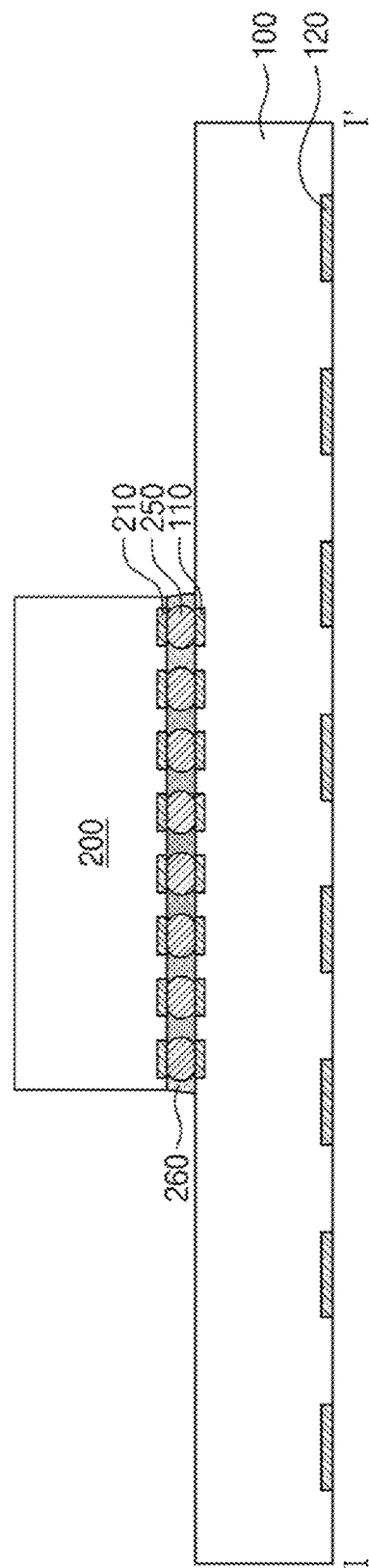
FIGS. 3, 4, 5, and 6 are cross-sectional views illustrating a method of manufacturing a semiconductor package according to some example embodiments of the inventive concepts.

Referring to FIG. 3, a package substrate 100 may be provided. The package substrate 100 may include substrate pads 110 adjacent to a top surface of the package substrate 100. The package substrate 100 may include terminal pads 120 adjacent to a bottom surface of the package substrate 100. A semiconductor chip 200 may be provided on the package substrate 100. The semiconductor chip 200 may be mounted on the package substrate 100. The semiconductor chip 200 may include chip pads 210 adjacent to a bottom surface of the semiconductor chip 200. The mounting of the semiconductor chip 200 may include forming chip bumps 250 between the substrate pads 110 and the chip pads 210. A chip underfill layer 260 may be formed between the package substrate 100 and the semiconductor chip 200 (e.g., between the package substrate 100 and the semiconductor chip 200 in the vertical direction).

Figure 4:
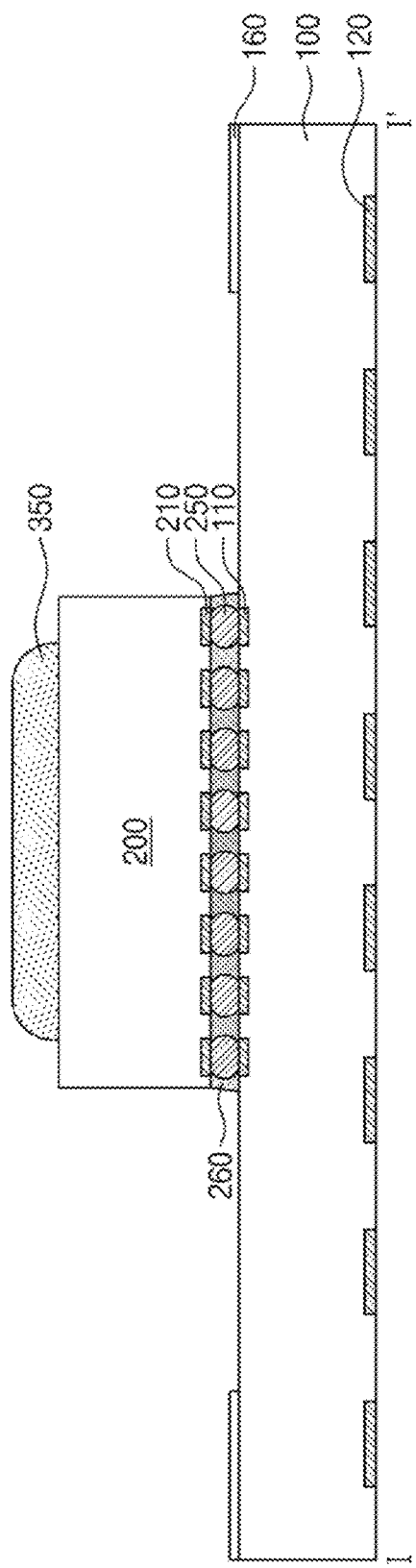

Referring to FIG. 4, an adhesive pattern 160 may be formed on the package substrate 100. A heat conductive layer 350 may be formed on the semiconductor chip 200. For some examples, the formation of the adhesive pattern 160 may include applying an adhesive material on the package substrate 100. For certain examples, the formation of the adhesive pattern 160 may include adhering an adhesive film on the package substrate 100. The adhesive pattern 160 may define an area in which an edge portion 302 of a heat dissipation structure 300 to be described later is adhered on the package substrate 100.

The formation of the heat conductive layer 350 may include applying a thermal interface material (TIM) on a top surface of the semiconductor chip 200. The heat conductive layer 350 may be formed on a center region of the semiconductor chip 200. A formation order of the adhesive pattern 160 and the heat conductive layer 350 may not be limited but may be changed.

Figure 5:
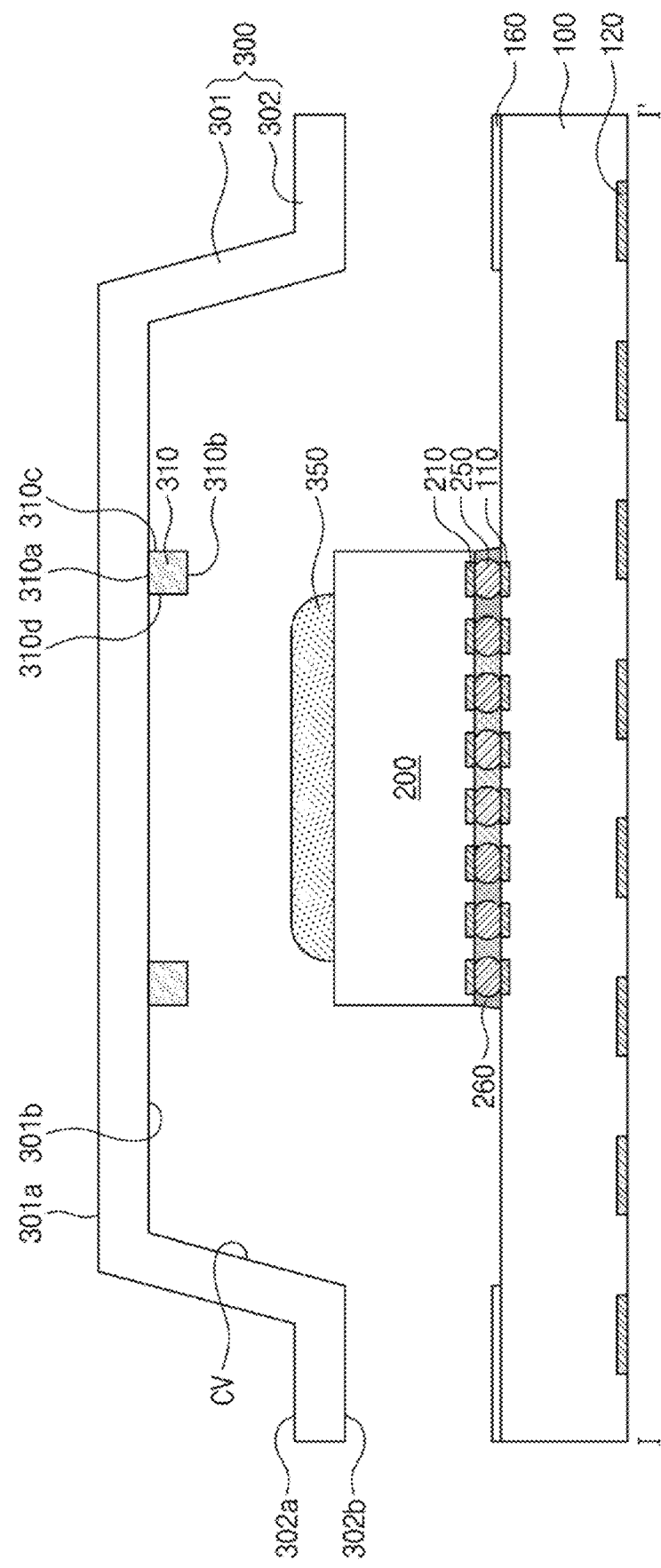

Referring to FIG. 5, a heat dissipation structure 300 and a dam structure 310 may be provided. The dam structure 310 may be provided to be adhered on a bottom surface 301b of a center portion 301 of the heat dissipation structure 300. The heat dissipation structure 300 may include the center portion 301 and an edge portion 302. The heat dissipation structure 300 may have a cavity CV defined by an inner sidewall of the center portion 301. The heat dissipation structure 300 may be aligned in such a way that the edge portion 302 of the heat dissipation structure 300 is disposed on the adhesive pattern 160 and an outer sidewall 310c of the dam structure 310 is vertically aligned with a sidewall of the semiconductor chip 200.

Figure 6:
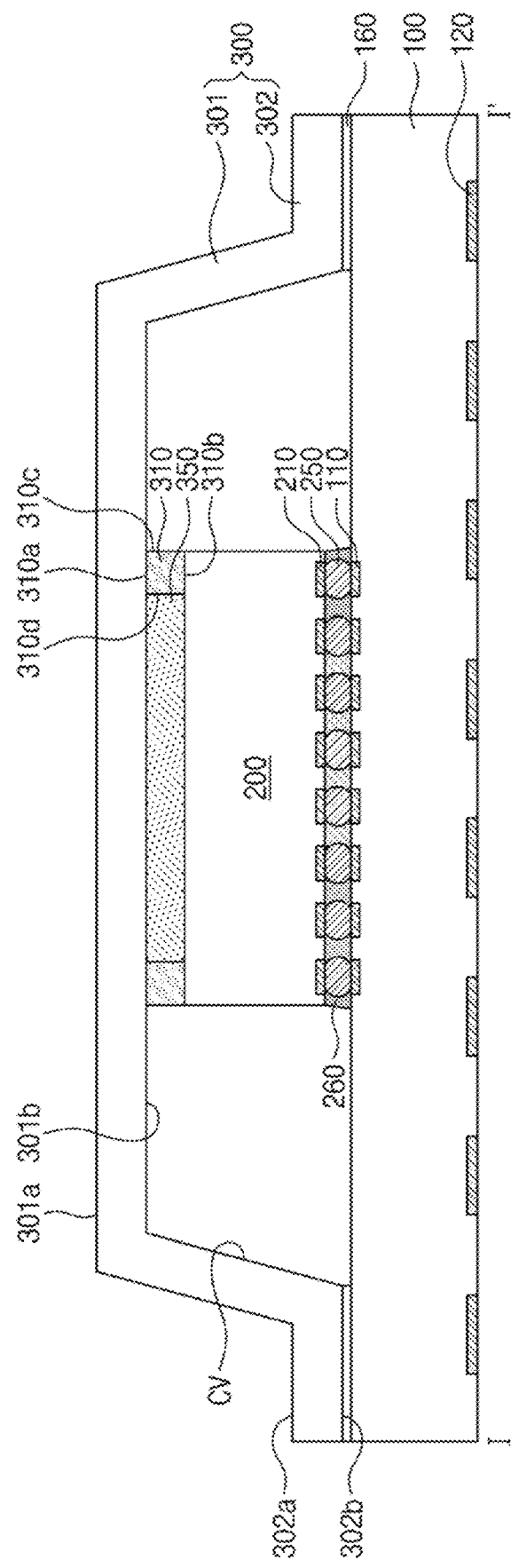

Referring to FIG. 6, the heat dissipation structure 300 may press the heat conductive layer 350. Thus, the semiconductor chip 200 may be disposed in the cavity CV, the edge portion 302 of the heat dissipation structure 300 may be in contact with the adhesive pattern 160, and a bottom surface 310b of the dam structure 310 may be in contact with the top surface of the semiconductor chip 200. As a result, the heat conductive layer 350 may fill a gap region between the center portion 301 of the heat dissipation structure 300 and the semiconductor chip 200 and between the inner sidewalls 310d of the dam structure 310. A process of applying heat may further be performed on the package substrate 100. The edge portion 302 of the heat dissipation structure 300 may be adhered on the adhesive pattern 160 by the process of applying heat.

According to some example embodiments of the inventive concepts, since the heat dissipation structure 300 and the dam structure 310 are provided in one structure, the heat dissipation structure 300 and the dam structure 310 may be formed on the semiconductor chip 200 at the same time. Thus, a process of manufacturing a semiconductor package may be simplified, and a manufacturing time and a manufacturing cost of the semiconductor package may be reduced.

Referring again to FIGS. 1 and 2, external terminals 150 may be formed on the bottom surface of the package substrate 100. The external terminals 150 may be formed on bottom surfaces of the terminal pads 120 so as to be electrically connected to the terminal pads 120, respectively.

Figure 7:
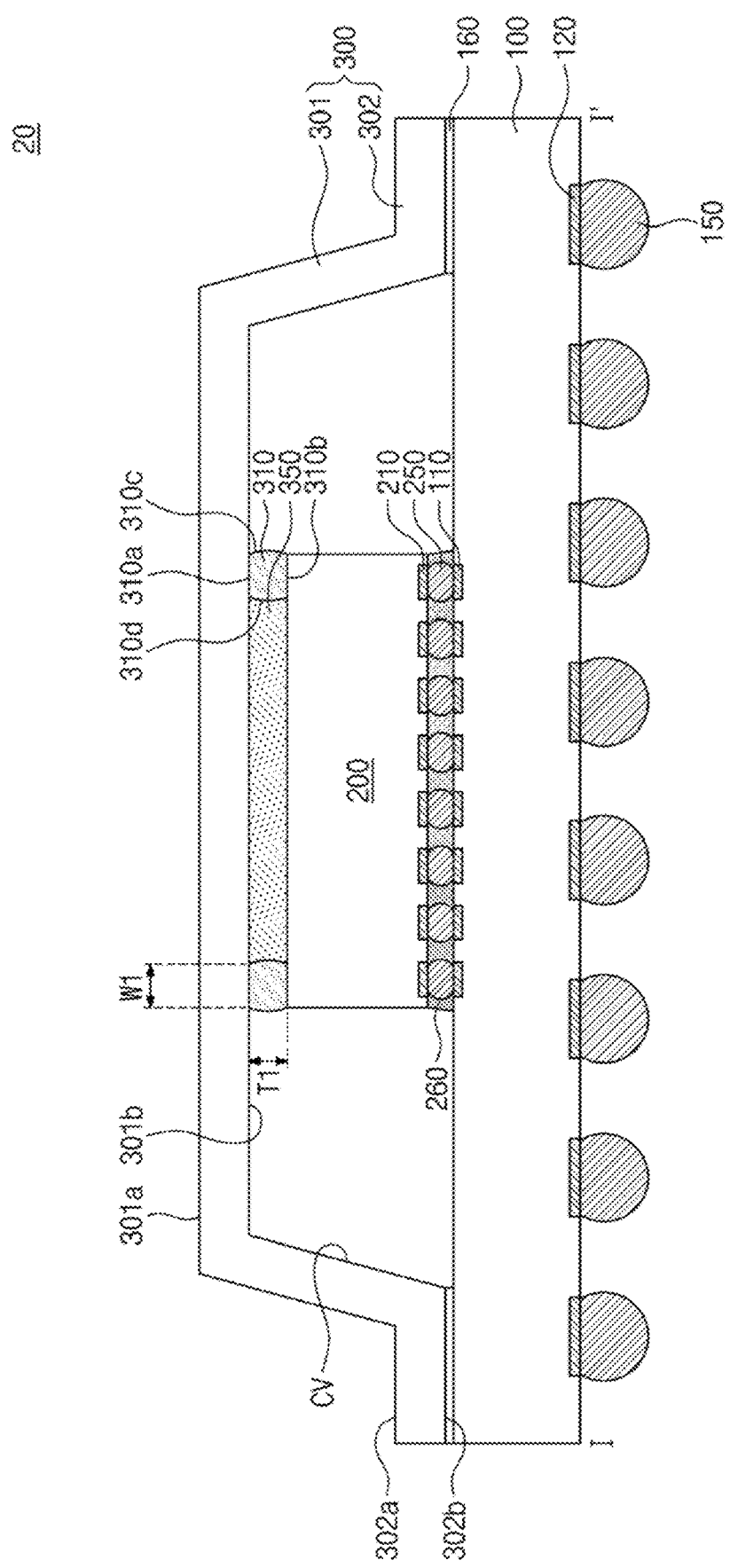
FIG. 7 is a cross-sectional view taken along the line I-I' of FIG. 1 to illustrate a semiconductor package according to some example embodiments of the inventive concepts.

FIG. 7 is a cross-sectional view taken along the line I-I' of FIG. 1 to illustrate a semiconductor package according to some example embodiments of the inventive concepts.

Referring to FIGS. 1 and 7, a semiconductor package 20 may include a package substrate 100, a semiconductor chip 200, a heat dissipation structure 300, a dam structure 310, and a heat conductive layer 350. Hereinafter, the descriptions to the same components and/or features as in the above embodiments will be omitted for the purpose of ease and convenience in explanation.

The dam structure 310 may be provided on a bottom surface 301b of a center portion 301 of the heat dissipation structure 300. The dam structure 310 may be disposed between the center portion 301 of the heat dissipation structure 300 and the semiconductor chip 200. The dam structure 310 may be disposed on a top surface of the semiconductor chip 200 and may be vertically spaced apart from the package substrate 100. A bottom surface 310b of the dam structure 310 may be in contact with the top surface of the semiconductor chip 200. A contact surface between the heat dissipation structure 300 and the dam structure 310 may be flat. The dam structure 310 may be disposed on an edge region of the semiconductor chip 200 when viewed in a plan view. For example, the dam structure 310 may have a rectangular ring shape when viewed in a plan view. The dam structure 310 may cover a sidewall of the heat conductive layer 350. In some example embodiments, and as shown in at least FIG. 7, an outer sidewall 310c of the dam structure 310 and an inner sidewall 310d of the dam structure 310 may both have curved surfaces. For example, a first thickness T1 of the dam structure 310 may range from about 50 μm to about 150 μm. For example, a first width W1 between the outer sidewall 310c and the inner sidewall 310d of the dam structure 310 may range from about 50 μm to about 200 μm.

Figure 8:
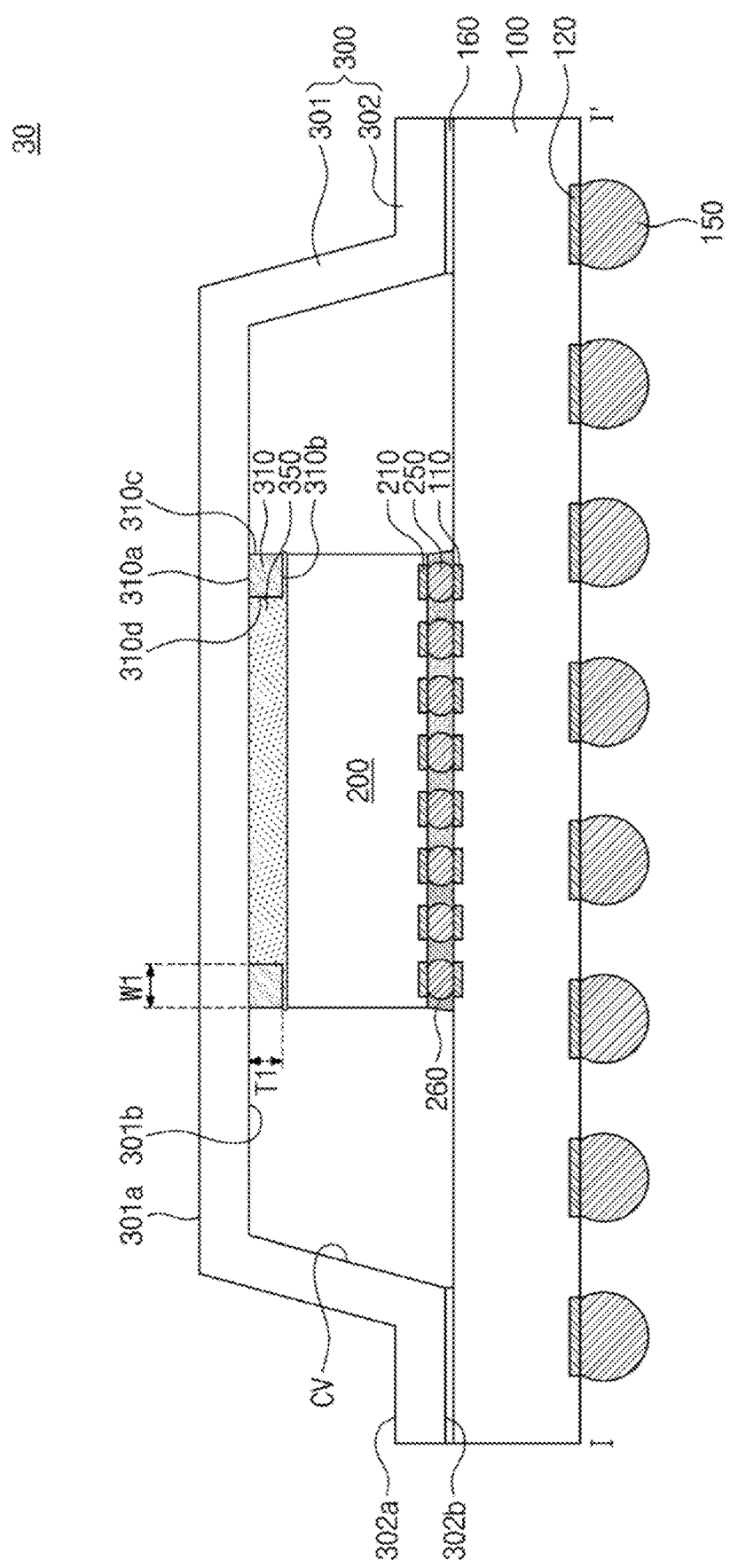
FIG. 8 is a cross-sectional view taken along the line I-I' of FIG. 1 to illustrate a semiconductor package according to some example embodiments of the inventive concepts.

FIG. 8 is a cross-sectional view taken along the line I-I' of FIG. 1 to illustrate a semiconductor package according to some example embodiments of the inventive concepts.

Referring to FIGS. 1 and 8, a semiconductor package 30 may include a package substrate 100, a semiconductor chip 200, a heat dissipation structure 300, a dam structure 310, and a heat conductive layer 350. Hereinafter, the descriptions to the same components and/or features as in the above embodiments will be omitted for the purpose of ease and convenience in explanation.

The heat conductive layer 350 may be disposed between a center portion 301 of the heat dissipation structure 300 and the semiconductor chip 200. The dam structure 310 may cover a sidewall of the heat conductive layer 350. The heat conductive layer 350 may be disposed between inner sidewalls 310d of the dam structure 310 and may extend between a bottom surface 310b of the dam structure 310 and the semiconductor chip 200. A major portion of a thermal interface material (TIM) of the heat conductive layer 350 may be disposed between the inner sidewalls 310d of the dam structure 310. A small amount of the thermal interface material (TIM) of the heat conductive layer 350 may be disposed between the bottom surface 310b of the dam structure 310 and the semiconductor chip 200. Thus, the heat conductive layer 350 may not flow out the top surface of the semiconductor chip 200 even in a high temperature state, and it is possible to prevent a void from being generated in the heat conductive layer 350.

A contact surface between the heat dissipation structure 300 and the dam structure 310 may be flat. A top surface 310a of the dam structure 310 may be located at the same level as a top surface of the heat conductive layer 350. The bottom surface 310b of the dam structure 310 may be located at a higher level than a top surface of the semiconductor chip 200. For example, a first thickness T1 of the dam structure 310 may range from about 50 μm to about 150 μm. For example, a first width W1 between the outer sidewall 310c and the inner sidewall 310d of the dam structure 310 may range from about 50 μm to about 200 μm.

Figure 9:
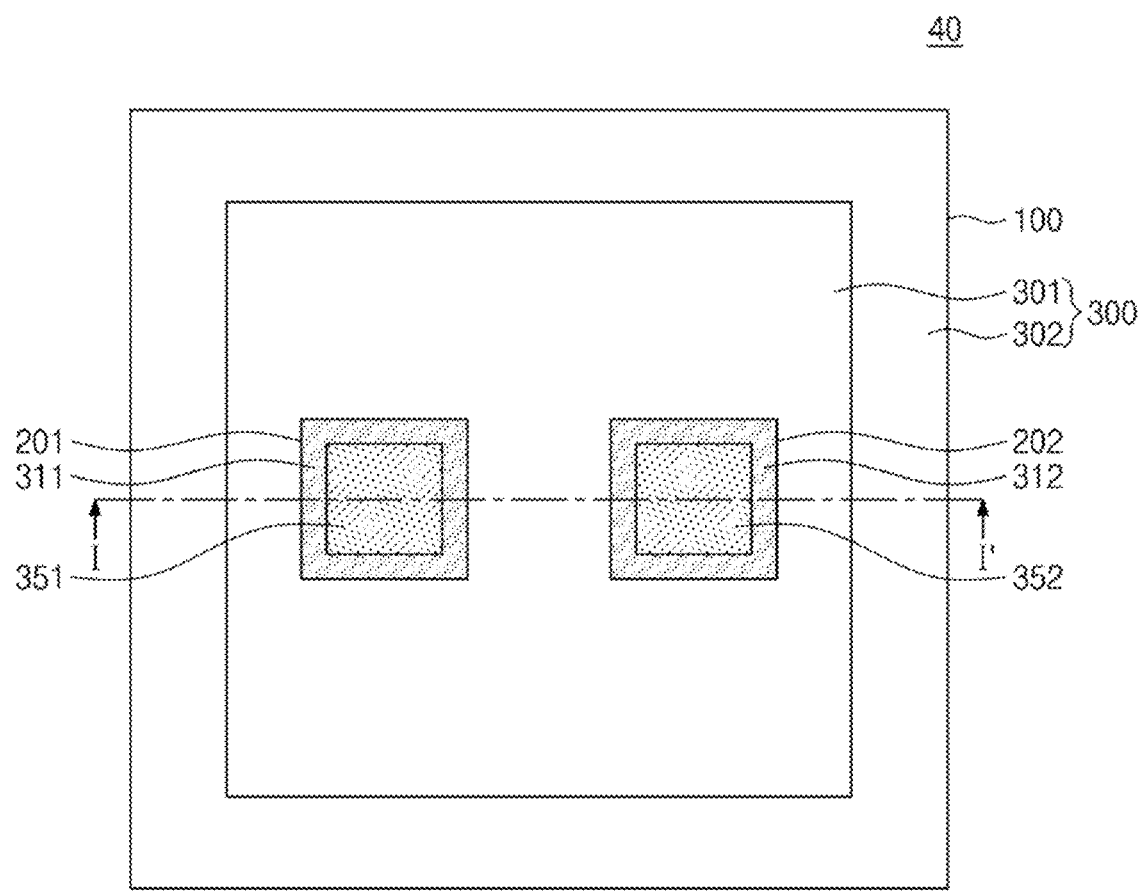
FIG. 9 is a plan view illustrating a semiconductor package according to some example embodiments of the inventive concepts.
Figure 10:
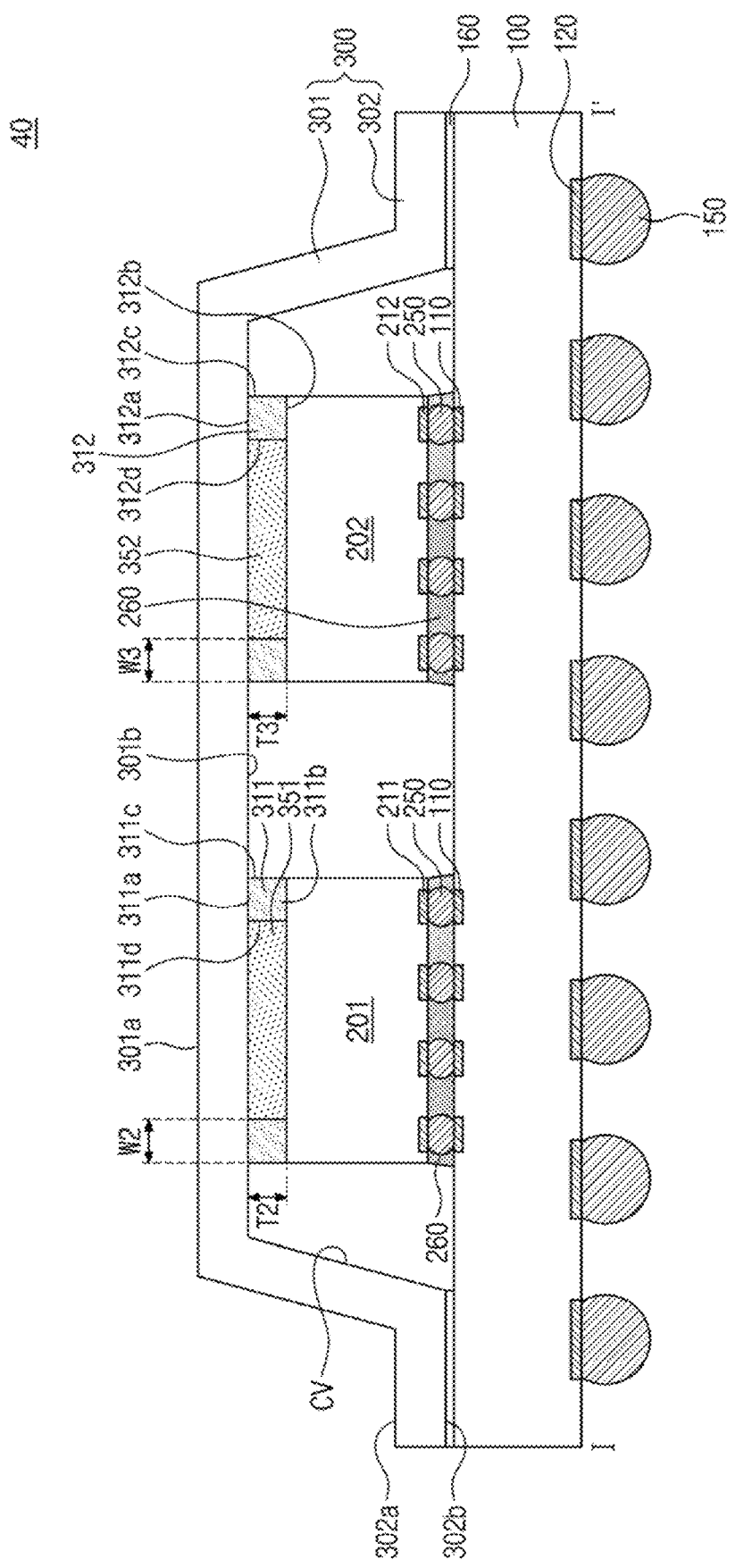
FIG. 10 is a cross-sectional view taken along a line I-I' of FIG. 9 to illustrate a semiconductor package according to some example embodiments of the inventive concepts.

FIG. 9 is a plan view illustrating a semiconductor package according to some example embodiments of the inventive concepts. FIG. 10 is a cross-sectional view taken along a line I-I' of FIG. 9 to illustrate a semiconductor package according to some example embodiments of the inventive concepts.

Referring to FIGS. 9 and 10, a semiconductor package 40 may include a package substrate 100, a heat dissipation structure 300, a first semiconductor chip 201 on the package substrate 100, a second semiconductor chip 202, a first dam structure 311, a second dam structure 312, a first heat conductive layer 351, and a second heat conductive layer 352.

The first semiconductor chip 201 may be mounted on (e.g., directly or indirectly on) a top surface of the package substrate 100. The first semiconductor chip 201 may include a memory chip, a logic chip, or a system-on-chip (SOC). For example, the first semiconductor chip 201 may be an ASIC chip or an application processor (AP) chip. The ASIC chip may include an application specific integrated circuit (ASIC). For example, the first semiconductor chip 201 may include a central processing unit (CPU) or a graphic processing unit (GPU). The first semiconductor chip 201 may include first chip pads 211 adjacent to a bottom surface of the first semiconductor chip 201. The first chip pads 211 may be electrically connected to corresponding substrate pads 110. The first chip pads 211 may include a conductive material and may include at least one of, for example, copper (Cu), aluminum (Al), tungsten (W), or titanium (Ti).

The second semiconductor chip 202 may be mounted on (e.g., directly or indirectly on) the top surface of the package substrate 100. The second semiconductor chip 202 may be laterally spaced apart from the first semiconductor chip 201, for example such that the first semiconductor chip 201 and the second semiconductor chip 202 are offset from each other in a horizontal direction and/or are isolated from direct contact with each other in the horizontal direction, where the horizontal direction is parallel to the top surface of the package substrate 100. The second semiconductor chip 202 may include a memory chip, a logic chip, or a system-on-chip (SOC). For example, the second semiconductor chip 202 may be an ASIC chip or an application processor (AP) chip. The ASIC chip may include an application specific integrated circuit (ASIC). For example, the second semiconductor chip 202 may include a central processing unit (CPU) or a graphic processing unit (GPU). The second semiconductor chip 202 may include second chip pads 212 adjacent to a bottom surface of the second semiconductor chip 202. The second chip pads 212 may be electrically connected to corresponding substrate pads 110. The second chip pads 212 may include a conductive material and may include at least one of, for example, copper (Cu), aluminum (Al), tungsten (W), or titanium (Ti).

Chip bumps 250 may be disposed between the first chip pads 211 and the corresponding substrate pads 110 and between the second chip pads 212 and the corresponding substrate pads 110. The first semiconductor chip 201 and the second semiconductor chip 202 may be electrically connected to the package substrate 100 through the chip bumps 250. The chip bumps 250 may include solder balls or solder bumps. The chip bumps 250 may include a conductive material and may include at least one metal of, for example, tin (Sn), lead (Pb), silver (Ag), zinc (Zn), nickel (Ni), gold (Au), copper (Cu), aluminum (Al), or bismuth (Bi). A pitch of the chip bumps 250 may be less than a pitch of the external terminals 150.

A chip underfill layer 260 may be disposed between the package substrate 100 and the first semiconductor chip 201 and between the package substrate 100 and the second semiconductor chip 202. The chip underfill layer 260 may fill a space between the chip bumps 250 and may seal or encapsulate the chip bumps 250.

The heat dissipation structure 300 may be provided on the package substrate 100. The heat dissipation structure 300 may include a center portion 301 and an edge portion 302. A top surface 301a of the center portion 301 of the heat dissipation structure 300 may be located at a higher level than top surfaces of the first and second semiconductor chips 201 and 202. A top surface 302a of the edge portion 302 of the heat dissipation structure 300 may be located at a lower level than the top surfaces of the first and second semiconductor chips 201 and 202. A bottom surface 301b of the center portion 301 of the heat dissipation structure 300 may be located at a higher level than the top surfaces of the first and second semiconductor chips 201 and 202. A bottom surface 302b of the edge portion 302 of the heat dissipation structure 300 may be located at a lower level than the top surfaces of the first and second semiconductor chips 201 and 202. The heat dissipation structure 300 may have a cavity CV defined by an inner sidewall of the center portion 301. Restated, the heat dissipation structure 300 may have an inner sidewall of the center portion 301 that at least partially or entirely defines the cavity CV. The first semiconductor chip 201 and the second semiconductor chip 202 may be disposed in (e.g., located partially or entirely within) the cavity CV as at least partially or entirely defined by the inner sidewall of the center portion 301 of the heat dissipation structure 300.

The first dam structure 311 may be provided on the bottom surface 301b of the center portion 301 of the heat dissipation structure 300. The first dam structure 311 may be disposed between the center portion 301 of the heat dissipation structure 300 and the first semiconductor chip 201. The first dam structure 311 may be disposed on the top surface of the first semiconductor chip 201 and may be vertically spaced apart from the package substrate 100. A bottom surface 311b of the first dam structure 311 may be in contact with the top surface of the first semiconductor chip 201. A contact surface between the heat dissipation structure 300 and the first dam structure 311 may be flat. The first dam structure 311 may be disposed on an edge region of the first semiconductor chip 201 when viewed in a plan view. For example, the first dam structure 311 may have a rectangular ring shape when viewed in a plan view. In some example embodiments, an outer sidewall 311c of the first dam structure 311 may be vertically aligned with a sidewall of the first semiconductor chip 201. For example, a second thickness T2 of the first dam structure 311 may range from about 50 μm to about 150 μm. For example, a second width W2 between the outer sidewall 311c and an inner sidewall 311d of the first dam structure 311 may range from about 50 μm to about 200 μm.

The second dam structure 312 may be provided on the bottom surface 301b of the center portion 301 of the heat dissipation structure 300. The second dam structure 312 may be disposed between the center portion 301 of the heat dissipation structure 300 and the second semiconductor chip 202. The second dam structure 312 may be disposed on the top surface of the second semiconductor chip 202 and may be vertically spaced apart from the package substrate 100. A bottom surface 312b of the second dam structure 312 may be in contact with the top surface of the second semiconductor chip 202. A contact surface between the heat dissipation structure 300 and the second dam structure 312 may be flat. The second dam structure 312 may be disposed on an edge region of the second semiconductor chip 202 when viewed in a plan view. For example, the second dam structure 312 may have a rectangular ring shape when viewed in a plan view. In some example embodiments, an outer sidewall 312c of the second dam structure 312 may be vertically aligned with a sidewall of the second semiconductor chip 202. For example, a third thickness T3 of the second dam structure 312 may range from about 50 μm to about 150 μm. For example, a third width W3 between the outer sidewall 312c and an inner sidewall 312d of the second dam structure 312 may range from about 50 μm to about 200 μm.

The first and second dam structures 311 and 312 may include a same material and/or a same total material composition. The first dam structure 311 may include a same material as the second dam structure 312 and/or may include a same total material composition as the second dam structure 312. The first and second dam structures 311 and 312 may include a material having elasticity and heat resistance. For example, the first and second dam structures 311 and 312 may have the heat resistance in which their physical and/or chemical properties do not change even at a high temperature (e.g., about 260 degrees Celsius). The first dam structure 311 and the second dam structure 312 may include materials not reacting with the first heat conductive layer 351 and the second heat conductive layer 352 at a room temperature or a high temperature, respectively. The first dam structure 311 and the second dam structure 312 may include the same material. The first and second dam structures 311 and 312 may each include a polymer and may each include, for example, a silicone-based polymer.

The first dam structure 311 and the second dam structure 312 may be adhered on the bottom surface 301b of the center portion 301 of the heat dissipation structure 300, and thus the first and second dam structures 311 and 312 and the heat dissipation structure 300 may be provided in one structure.

The first heat conductive layer 351 may be disposed between the center portion 301 of the heat dissipation structure 300 and the first semiconductor chip 201 and between the inner sidewalls 311d of the first dam structure 311. The first heat conductive layer 351 may be in direct contact with the bottom surface 301b of the center portion 301 of the heat dissipation structure 300, the top surface of the first semiconductor chip 201, and the inner sidewalls 311d of the first dam structure 311. The first dam structure 311 may cover a sidewall of the first heat conductive layer 351. The first heat conductive layer 351 may be disposed on the top surface of the first semiconductor chip 201. A top surface 311a of the first dam structure 311 may be located at the same level as a top surface of the first heat conductive layer 351. The bottom surface 311b of the first dam structure 311 may be located at the same level as a bottom surface of the first heat conductive layer 351. Thus, the first heat conductive layer 351 may not come out of the first dam structure 311 but may be fixed between the heat dissipation structure 300 and the first semiconductor chip 201.

The second heat conductive layer 352 may be disposed between the center portion 301 of the heat dissipation structure 300 and the second semiconductor chip 202 and between the inner sidewalls 312d of the second dam structure 312. The second heat conductive layer 352 may be in direct contact with the bottom surface 301b of the center portion 301 of the heat dissipation structure 300, the top surface of the second semiconductor chip 202, and the inner sidewalls 312d of the second dam structure 312. The second dam structure 312 may cover a sidewall of the second heat conductive layer 352. The second heat conductive layer 352 may be disposed on the top surface of the second semiconductor chip 202. A top surface 312a of the second dam structure 312 may be located at the same level as a top surface of the second heat conductive layer 352. The bottom surface 312b of the second dam structure 312 may be located at the same level as a bottom surface of the second heat conductive layer 352. Thus, the second heat conductive layer 352 may not come out of the second dam structure 312 but may be fixed between the heat dissipation structure 300 and the second semiconductor chip 202.

The first and second heat conductive layers 351 and 352 may have a thermal conductivity higher than that of air. The first and second heat conductive layers 351 and 352 may include the same material and/or a same total material composition. The first heat conductive layer 351 may include a same material as the second heat conductive layer 352 and/or may include a same total material composition as the second heat conductive layer 352. The first and second heat conductive layers 351 and 352 may include a thermal interface material (TIM). For example, the thermal interface material (TIM) may include a polymer and heat conductive particles. The heat conductive particles may be dispersed in the polymer.

According to some example embodiments of the inventive concepts, the dam structure and the heat dissipation structure may be disposed on the semiconductor chip. Thus, the heat conductive layer may not flow out of the top surface of the semiconductor chip even in a high temperature state, and it is possible to prevent a void from being generated in the heat conductive layer. Heat generated from the semiconductor chip may be quickly transmitted to the heat dissipation structure through the heat conductive layer, and thus the semiconductor package with improved heat dissipation efficiency may be provided.

In addition, according to some example embodiments of the inventive concepts, the heat dissipation structure and the dam structure may be provided in one structure, and thus the heat dissipation structure and the dam structure may be formed on the semiconductor chip at the same time. As a result, a process of manufacturing the semiconductor package may be simplified, and a manufacturing time and a manufacturing cost of the semiconductor package may be reduced.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A semiconductor package, comprising:
  a package substrate;
  a semiconductor chip on the package substrate;
  a heat dissipation structure on the package substrate, the heat dissipation structure including a center portion and an edge portion;

a dam structure on a bottom surface of the center portion of the heat dissipation structure, the dam structure on a top surface of the semiconductor chip; and a heat conductive layer between the center portion of the heat dissipation structure and the semiconductor chip, wherein a top surface of the dam structure is located at a same distance from a top surface of the package substrate in a vertical direction as a top surface of the heat conductive layer, wherein the vertical direction is perpendicular to the top surface of the package substrate, and the heat conductive layer has a portion that extends vertically between a bottommost surface of the dam structure and the top surface of the semiconductor chip.

2. The semiconductor package of claim 1, wherein the bottom surface of the center portion of the heat dissipation structure is further from the top surface of the package substrate in the vertical direction than the top surface of the semiconductor chip, and a top surface of the edge portion of the heat dissipation structure is closer to the top surface of the package substrate in the vertical direction than the top surface of the semiconductor chip.

3. The semiconductor package of claim 1, wherein an outer sidewall of the dam structure is vertically aligned with a sidewall of the semiconductor chip such that the outer sidewall of the dam structure is coplanar with the sidewall of the semiconductor chip.

4. The semiconductor package of claim 1, wherein the dam structure has a rectangular ring shape when viewed in a plan view, and an outer sidewall and an inner sidewall of the dam structure are flat.

5. The semiconductor package of claim 1, wherein the heat conductive layer includes a thermal interface material (TIM).

6. The semiconductor package of claim 1, wherein a thickness of the dam structure in the vertical direction ranges from about 50 µm to about 150 µm.

7. The semiconductor package of claim 1, wherein a width between an outer sidewall and an inner sidewall of the dam structure in a horizontal direction that is parallel to the top surface of the package substrate ranges from about 50 µm to about 200 µm.

8. The semiconductor package of claim 1, wherein the heat conductive layer is between inner sidewalls of the dam structure.

9. The semiconductor package of claim 1, further comprising:

a chip underfill layer between the package substrate and the semiconductor chip.

10. A semiconductor package, comprising:

a package substrate;

a first semiconductor chip on the package substrate;

a heat dissipation structure on the package substrate, the heat dissipation structure including a center portion and an edge portion;

a first heat conductive layer between the center portion of the heat dissipation structure and the first semiconductor chip; and a first dam structure between the center portion of the heat dissipation structure and the first semiconductor chip and covering a sidewall of the first heat conductive layer, wherein the first dam structure includes a silicone-based polymer, and wherein the first heat conductive layer has a portion at tends vertically between a bottommost surface of the first dam structure and a top surface of the first semiconductor chip.

11. The semiconductor package of claim 10, further comprising:

a second semiconductor chip on the package substrate and laterally spaced apart from the first semiconductor chip.

12. The semiconductor package of claim 11, further comprising:

a second heat conductive layer between the center portion of the heat dissipation structure and the second semiconductor chip; and a second dam structure between the center portion of the heat dissipation structure and the second semiconductor chip and covering a sidewall of the second heat conductive layer.

13. The semiconductor package of claim 12, wherein the first dam structure includes a same material as the second dam structure, and the first heat conductive layer includes a same material as the second heat conductive layer.

14. The semiconductor package of claim 11, wherein the heat dissipation structure has an inner sidewall of the center portion of the heat dissipation structure that at least partially defines a cavity, and the first semiconductor chip and the second semiconductor chip are located within the cavity.

15. The semiconductor package of claim 10, further comprising:

an adhesive pattern between the package substrate and the edge portion of the heat dissipation structure, wherein the heat dissipation structure is fixed on the package substrate by the adhesive pattern.

16. The semiconductor package of claim 10, wherein a cross section of the center portion of the heat dissipation structure has an inverted U-shape, and the edge portion of the heat dissipation structure is on an edge region of the package substrate when viewed in a plan view.

17. A semiconductor package, comprising:

a package substrate that includes substrate pads adjacent to a top surface of the package substrate;

a semiconductor chip on the package substrate, the semiconductor chip including chip pads adjacent to a bottom surface of the semiconductor chip;

chip bumps between the substrate pads and the chip pads;

a chip underfill layer between the package substrate and the semiconductor chip;

a heat dissipation structure on the package substrate, the heat dissipation structure including a center portion and an edge portion;

a dam structure on a bottom surface of the center portion of the heat dissipation structure; and a heat conductive layer between the center portion of the heat dissipation structure and the semiconductor chip, wherein a contact surface between the heat dissipation structure and the dam structure is flat, wherein a top surface of the center portion of the heat dissipation structure is located further from the top surface of the package substrate in a vertical direction than a top surface of the edge portion of the heat dissipation structure, wherein the vertical direction is perpendicular to the top surface of the package substrate, wherein the bottom surface of the center portion of the heat dissipation structure is located further from the top surface of the package substrate in the vertical direction than a bottom surface of the edge portion of the heat dissipation structure, and wherein the heat conductive layer has a portion that extends vertically between a bottommost structure of the dam structure and a top surface of the semiconductor chip.

18. The semiconductor package of claim 17, wherein the dam structure has a rectangular ring shape when viewed in a plan view, and an outer sidewall of the dam structure and an inner sidewall of the dam structure both have curved surfaces.

19. The semiconductor package of claim 17, wherein a top surface of the dam structure is located at a same distance from the top surface of the package substrate in the vertical direction as a top surface of the heat conductive layer.

* * * * *